(12) United States Patent
Chen et al.

(10) Patent No.: US 8,330,267 B2
(45) Date of Patent: Dec. 11, 2012

(54) SEMICONDUCTOR PACKAGE

(75) Inventors: Kuang-Hsiung Chen, Taoyuan County (TW); Pao-Ming Hsieh, Hsinchu County (TW); Yuan-Chang Su, Taoyuan County (TW); Shih-Fu Huang, Hsinchu County (TW); Bernd Karl Appelt, Gulf Breeze, FL (US)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 544 days.

(21) Appl. No.: 12/607,405

(22) Filed: Oct. 28, 2009

(65) Prior Publication Data

US 2011/0057301 A1    Mar. 10, 2011

(30) Foreign Application Priority Data

Sep. 8, 2009 (TW) .............................. 98130284 A (51) Int. Cl.
H01L 23/04 (2006.01)
(52) U.S. Cl. ......................................... 257/698; 257/784
(58) Field of Classification Search .................. 257/686, 257/777, 723, 724, 784, 701, 698
See application file for complete search history.

(56) References Cited

U.S. PATENT DOCUMENTS

| | | | |
|---|---|---|---|
| 5,583,376 A | 12/1996 | Sickler et al. | |
| 5,592,025 A | 1/1997 | Clark et al. | |
| 5,874,784 A | 2/1999 | Aoki et al. | |
| 5,994,773 A | 11/1999 | Hirakawa | |
| 6,060,775 A | 5/2000 | Ano et al. | |
| 6,080,932 A | 6/2000 | Smith et al. | |
| 6,087,717 A | 7/2000 | Ano et al. | |
| 6,177,636 B1 | 1/2001 | Fjelstad | |
| 6,198,165 B1 | 3/2001 | Yamaji et al. | |
| 6,232,650 B1 | 5/2001 | Fujisawa et al. | |
| 6,232,661 B1 | 5/2001 | Amagai et al. | |
| 6,242,815 B1 | 6/2001 | Hsu et al. | |
| 6,271,057 B1 | 8/2001 | Lee et al. | |
| 6,331,451 B1 | 12/2001 | Fusaro et al. | |
| 6,358,780 B1 | 3/2002 | Smith et al. | |
| 6,552,430 B1 | 4/2003 | Perez et al. | |
| 6,580,159 B1 | 6/2003 | Fusaro et al. | |
| 6,663,946 B2 | 12/2003 | Seri et al. | |
| 6,774,317 B2 | 8/2004 | Fjelstad | |
| 6,861,757 B2 | 3/2005 | Shimoto et al. | |
| 6,977,348 B2 | 12/2005 | Ho et al. | |
| 7,338,884 B2 | 3/2008 | Shimoto et al. | |
| 7,405,486 B2 * | 7/2008 | Kato .............................. 257/777 |
| 7,423,340 B2 | 9/2008 | Huang et al. | |
| 7,566,969 B2 | 7/2009 | Shimanuki | |
| 7,595,553 B2 | 9/2009 | Nagamatsu et al. | |

(Continued)

Primary Examiner — S. V. Clark
(74) Attorney, Agent, or Firm — Foley & Lardner LLP (57) ABSTRACT

A semiconductor package includes a patterned metal foil, a chip, wires, a patterned dielectric layer, an adhesive layer, and a molding compound. The patterned metal foil has a first surface and a second surface opposite thereto. The patterned dielectric layer is disposed on the second surface and has openings exposing at least a portion of the patterned metal foil to form joints for external electrical connection. The chip is disposed on the first surface. The adhesive layer is disposed between the chip and the patterned metal foil. The wires respectively connect the chip and the patterned metal foil. The patterned dielectric layer is located below intersections between the wires and the patterned metal foil. The patterned dielectric layer, the wires, and the patterned metal foil overlap with one another on a plane. The molding compound is disposed on the first surface and covers the chip and the wires.

20 Claims, 7 Drawing Sheets

U.S. PATENT DOCUMENTS

| | | |
|---|---|---|
| 7,612,295 B2 | 11/2009 | Takada et al. |
| 7,902,648 B2 * | 3/2011 | Lee .................................. 257/676 |
| 7,948,090 B2 | 5/2011 | Manepalli et al. |
| 2002/0030266 A1 * | 3/2002 | Murata ........................ 257/698 |
| 2002/0153618 A1 * | 10/2002 | Hirano et al. ................ 257/784 |
| 2002/0171145 A1 | 11/2002 | Higuchi et al. |
| 2002/0173069 A1 * | 11/2002 | Shibata ........................ 438/106 |
| 2002/0182776 A1 | 12/2002 | Fujisawa et al. |
| 2002/0192872 A1 * | 12/2002 | Fujisawa et al. ............. 438/123 |
| 2003/0030137 A1 * | 2/2003 | Hashimoto ................... 257/690 |
| 2003/0034553 A1 * | 2/2003 | Ano .............................. 257/690 |
| 2003/0098502 A1 * | 5/2003 | Sota ............................. 257/688 |
| 2004/0080054 A1 | 4/2004 | Chinda et al. |
| 2004/0110319 A1 * | 6/2004 | Fukutomi et al. ............ 438/106 |
| 2005/0186704 A1 | 8/2005 | Yee et al. |
| 2007/0234563 A1 | 10/2007 | Sakaguchi et al. |
| 2007/0272940 A1 * | 11/2007 | Lee et al. ........................ 257/99 |
| 2008/0284017 A1 | 11/2008 | Lee et al. |
| 2009/0115072 A1 * | 5/2009 | Rhyner et al. ................ 257/778 |
| 2009/0294160 A1 | 12/2009 | Yoshimura et al. |
| 2010/0288541 A1 | 11/2010 | Appelt et al. |
| 2010/0289132 A1 | 11/2010 | Huang et al. |
| 2010/0314744 A1 | 12/2010 | Huang et al. |
| 2010/0320610 A1 | 12/2010 | Huang et al. |
| 2011/0074008 A1 | 3/2011 | Hsieh |
| 2011/0084370 A1 | 4/2011 | Su et al. |
| 2011/0084372 A1 | 4/2011 | Su et al. |
| 2011/0169150 A1 | 7/2011 | Su et al. |

* cited by examiner

SEMICONDUCTOR PACKAGE

CROSS-REFERENCE TO RELATED APPLICATION

This application claims the priority benefit of Taiwan application serial no. 98130284, filed on Sep. 8, 2009. The entirety of the above-mentioned patent application is hereby incorporated by reference herein and made a part of this specification.

BACKGROUND OF THE DISCLOSURE

1. Field of the Disclosure

The disclosure relates to a package. More particularly, the disclosure relates to a semiconductor package with high manufacturing yield.

2. Description of Related Art

Semiconductor industry is one of the most rapidly advanced hi-tech industries in recent years. With progress of electronic technologies, hi-tech electronic industries have developed user-friendly products equipped with better functions than ever.

At present, precision semiconductor chips are frequently packaged for protection during fabrication of semiconductors. According to a method of packaging a chip, first, the chip is disposed on a carrier, and the chip and the carrier are wire-bonded. Next, a molding compound encapsulating the chip and the wires is formed on the carrier, so as to form a semiconductor package.

Main functions of the semiconductor package include (1) providing the chip with a plurality of electrical paths to electrically connect the chip to external electronic devices; (2) providing the chip with a plurality of high density joints electrically connected to low density joints of the carrier and thereby to the external electronic devices; (3) dissipating heat generated by the chip to external surroundings; and (4) protecting the chip from environmental contamination.

SUMMARY OF THE DISCLOSURE

The disclosure is directed to a semiconductor package of which a patterned metal foil can securely carry a chip.

In the disclosure, a semiconductor package including a patterned metal foil, a first patterned dielectric layer, a chip, an adhesive layer, a plurality of wires, and a molding compound is provided. The patterned metal foil has a first surface and a second surface opposite to the first surface. The first patterned dielectric layer is disposed on the second surface of the patterned metal foil. Here, the first patterned dielectric layer has a plurality of first openings exposing at least a portion of the patterned metal foil to form a plurality of second joints for downward external electrical connection. The chip is disposed on the first surface of the patterned metal foil. The adhesive layer is disposed between the chip and the patterned metal foil. The wires respectively connect the chip and the patterned metal foil. Here, a portion of the first patterned dielectric layer is disposed below intersections between the wires and the patterned metal foil, and the portion of the first patterned dielectric layer, the wires, and the patterned metal foil overlap with one another on a plane. The molding compound is disposed on the first surface and covers the chip and the wires.

In the disclosure, a semiconductor package including a patterned metal foil, a first patterned dielectric layer, a chip, an adhesive layer, a plurality of wires, and a molding compound is provided as well. The patterned metal foil has a first surface and a second surface opposite to the first surface. Besides, the patterned metal foil includes a die pad and a plurality of leads disposed at periphery of the die pad. The first patterned dielectric layer is disposed on the second surface of the patterned metal foil. Here, the first patterned dielectric layer has a plurality of first openings exposing at least a portion of the patterned metal foil to form a plurality of second joints for downward external electrical connection, and some of the first openings are located right below the die pad and expose the die pad. The chip is disposed on the first surface of the patterned metal foil and located on the die pad. The adhesive layer is disposed between the chip and the patterned metal foil. The wires connect the chip and the patterned metal foil, and at least some of the wires connect the leads. The molding compound is disposed on the first surface and covers the chip and the wires.

In the disclosure, a semiconductor package including a patterned metal foil, a patterned dielectric layer, a chip, a plurality of conductive bumps, and a molding compound is provided as well. The patterned metal foil has a first surface and a second surface opposite to the first surface. The patterned dielectric layer is disposed on the second surface of the patterned metal foil. Here, the patterned dielectric layer has a plurality of openings exposing at least a portion of the patterned metal foil to form a plurality of joints for downward external electrical connection. The chip is disposed on the first surface. The conductive bumps are disposed between the chip and the patterned metal foil. The molding compound is disposed on the first surface and covers the chip and the conductive bumps.

Based on the above, a carrying board formed by the patterned metal foil and the patterned dielectric layer can securely carry the chip according to the disclosure. Besides, the carrying board is rather thin and accordingly does not increase the entire thickness of the semiconductor package, which is conducive to minimization of the semiconductor package.

In order to make the aforementioned and other features and advantages of the disclosure more comprehensible, embodiments accompanying figures are described in detail below.

BRIEF DESCRIPTION OF THE DRAWINGS

The accompanying drawings are included to provide a further understanding of the disclosure and are incorporated in and constitute a part of this specification. The drawings illustrate embodiments of the disclosure and, together with the description, serve to explain the principles of the disclosure.

DESCRIPTION OF EMBODIMENTS

Figure 1:
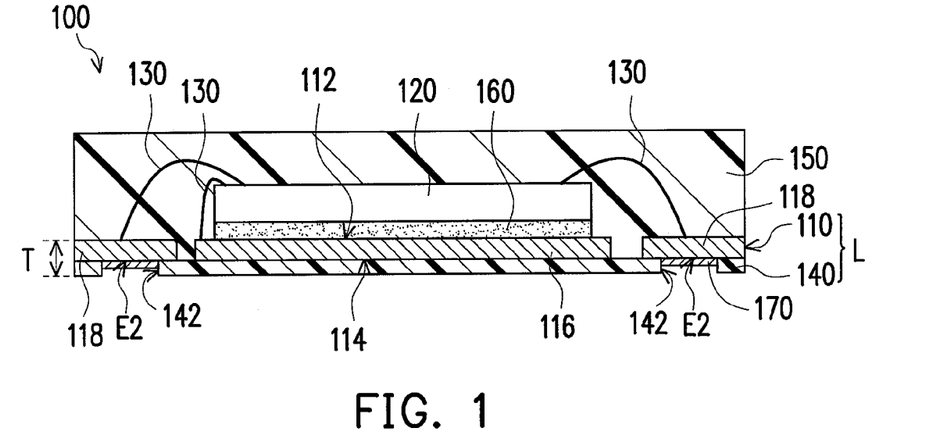
FIGS. 1-4 and FIGS. 6-10 are cross-sectional views respectively illustrating semiconductor packages according to embodiments of the disclosure.

As indicated in FIG. 1, the semiconductor package 100 of the embodiment includes a patterned metal foil 110, a chip 120, a plurality of wires 130, a patterned dielectric layer 140, a molding compound 150, and an adhesive layer 160. The semiconductor package 100 of the embodiment is, for example, a quad flat non-leaded package.

The patterned metal foil 110 has a first surface 112 and a second surface 114 opposite thereto. In the embodiment, the patterned metal foil 110 includes a die pad 116 and a plurality of leads 118, wherein the die pad 116 is a contiguous conductive layer. The chip 120 is disposed on the die pad 116 and located on the first surface 112, and the leads 118 are disposed at periphery of the die pad 116. A material of the patterned metal foil 110 includes copper or other materials with great conductivity. Here, the patterned metal foil 110 can have at least a dummy pad (not shown) and at least a dummy trace (not shown).

The wires 130 connect the chip 120 and the patterned metal foil 110. Here, a material of the wires 130 includes gold, copper, or aluminum. In detail, according to the embodiment, some of the wires 130 can connect the leads 118 and the chip 120, and the other wires 130 can alternately connect the die pad 116 and the chip 120, such that the chip 120 is grounded. Additionally, in order to secure the chip 120 onto the patterned metal foil 110, the adhesive layer 160 can be disposed between the chip 120 and the patterned metal foil 110, and a material of the adhesive layer 160 can be an insulating material (e.g. resin).

The patterned dielectric layer 140 is disposed on the second surface 114 and has a plurality of openings 142 exposing a portion of the second surface 114 to form a plurality of second joints E2 for external electrical connection. In this embodiment, a total thickness T of the patterned dielectric layer 140 and the patterned metal foil 110 approximately ranges from 40 micrometers to 130 micrometers. According to the embodiment, the patterned dielectric layer 140 and the patterned metal foil 110 can together form a carrying board.

To prevent the second joints E2 from external contamination or oxidation, a surface treatment layer 170 can be formed on the second joints E2 according to the embodiment. A material of the surface treatment layer 170 includes nickel/gold, electroless nickel electroless palladium immersion gold, silver, tin, an alloy thereof, tin paste, or an organic soldering preservative (OSP). The molding compound 150 can be disposed on the first surface 112 and can cover the chip 120, the wires 130, the patterned metal foil 110, and the patterned dielectric layer 140.

It should be mentioned that the carrying board formed by the patterned metal foil 110 and the patterned dielectric layer 140 can securely carry the chip 120 according to the embodiment. Besides, the carrying board is rather thin and accordingly does not increase the entire thickness of the semiconductor package 100, which is conducive to minimization of the semiconductor package 100. Moreover, the patterned metal foil 110 of the embodiment is quite thin as well, and therefore the manufacturing costs can be reduced.

Figure 2:
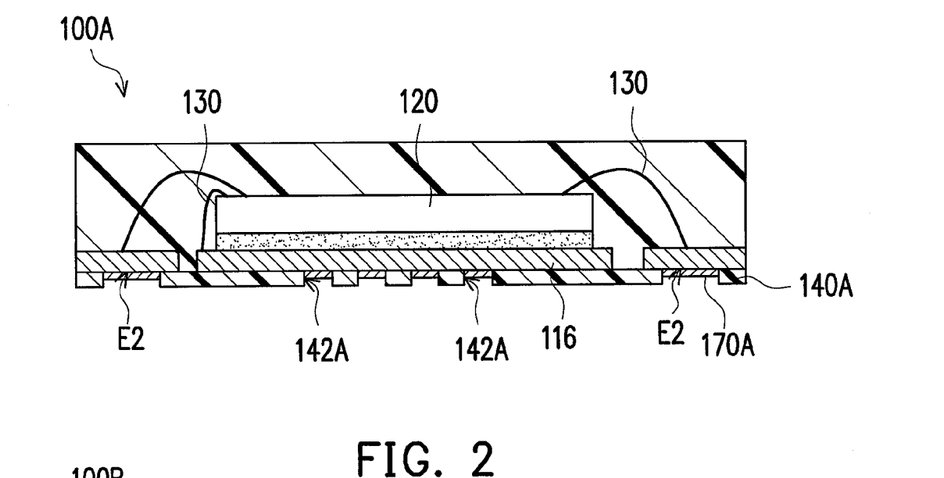

With reference to FIG. 2, the structure of the semiconductor package 100A of the embodiment is similar to the structure of the semiconductor package 100 depicted in FIG. 1, while the difference between the semiconductor package 100A and the semiconductor package 100 lies in that some openings 142A of the patterned dielectric layer 140A in the embodiment are located below the chip 120 and expose the die pad 116. The openings 142A can be located right below the die pad 116. According to the embodiment, a surface treatment layer 170A can be formed on the die pad 116 and the second joints E2 exposed by the openings 142A.

As such, during operation of the chip 120, the heat generated by the chip 120 can be conducted to the die pad 116 and then transferred to the external surroundings through the openings 142A exposing the die pad 116. Besides, when some of the wires 130 are connected between the die pad 116 and the chip 120, the chip 120 can be electrically connected to the die pad 116 and then electrically connected to other electronic devices (e.g. circuit boards) through a portion of the die pad 116 exposed by the openings 142A.

Figure 3:
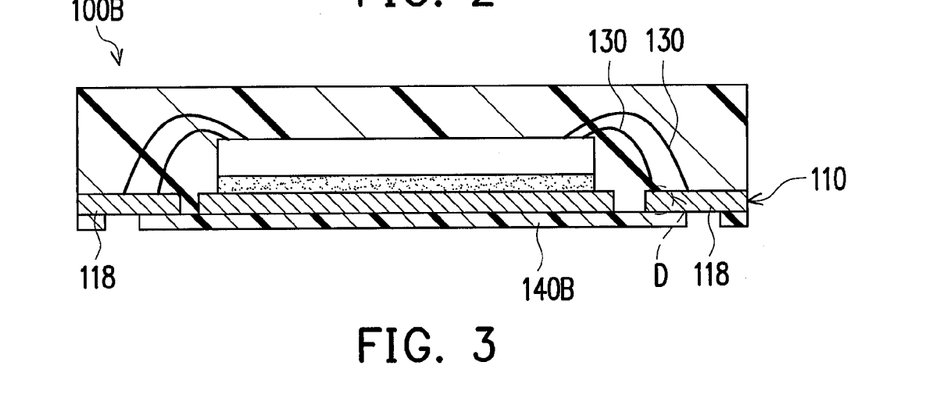

With reference to FIG. 3, the structure of the semiconductor package 100B of the embodiment is similar to the structure of the semiconductor package 100 depicted in FIG. 1, while the difference between the semiconductor package 100B and the semiconductor package 100 lies in that a portion of the patterned dielectric layer 140B in the embodiment is located below intersections D between the wires 130 and the patterned metal foil 110. That is to say, the patterned metal foil 110, the wires 130, and the patterned dielectric layer 140B can overlap with one another on a plane. As such, a portion of the patterned metal foil 110 impacted by the wire-bonding process can be supported by the patterned dielectric layer 140B, such that the patterned metal foil 110 is not overly distorted, and that yield of the wire-bonding process can be improved. Moreover, in the embodiment, two of the wires 130 can be alternatively connected to the same lead 118.

Figure 4:
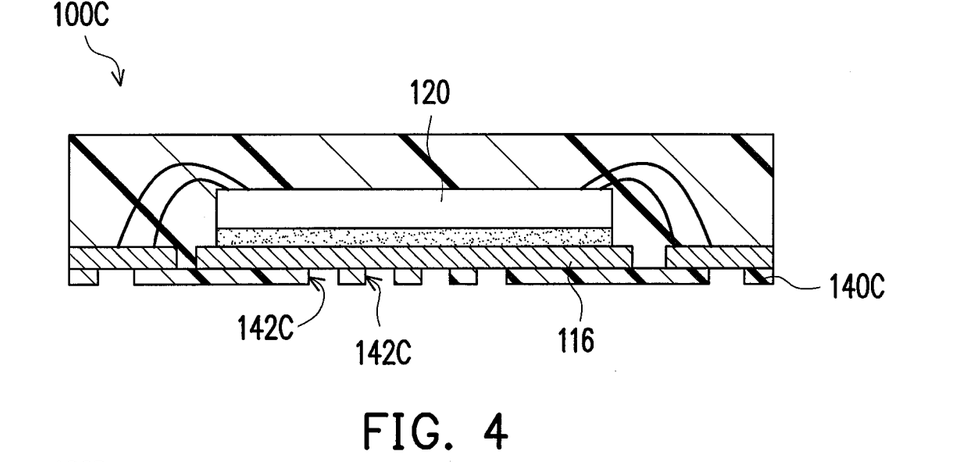

With reference to FIG. 4, the structure of the semiconductor package 100C of the embodiment is similar to the structure of the semiconductor package 100B depicted in FIG. 3, while the difference between the semiconductor package 100C and the semiconductor package 100B lies in that some openings 142C of the patterned dielectric layer 140C in the embodiment are located below the chip 120 and expose the die pad 116.

Figure 5A:
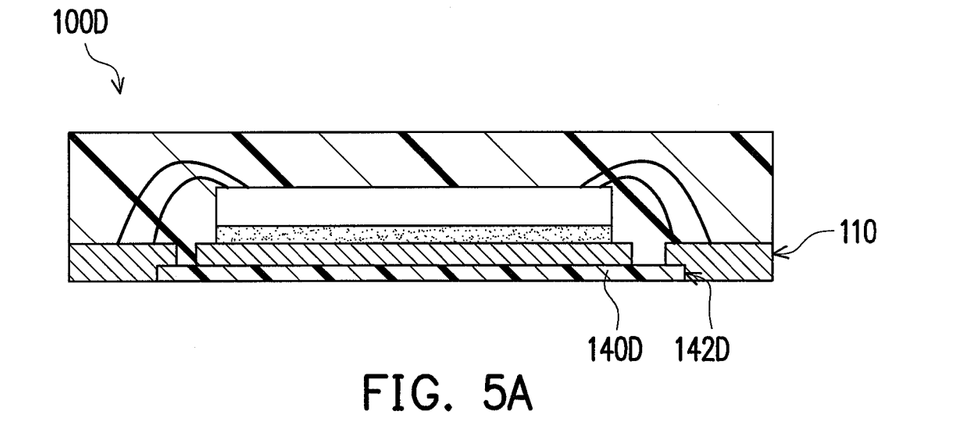
FIG. 5A is a cross-sectional view illustrating a semiconductor package according to an embodiment of the disclosure.
Figure 5B:
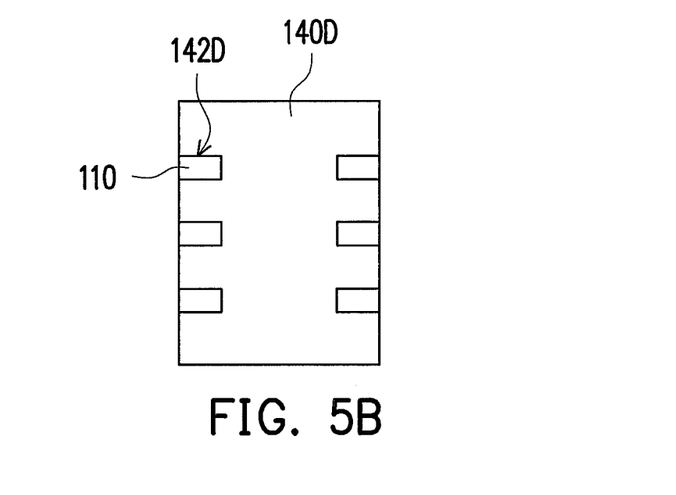
FIG. 5B is a bottom view illustrating the semiconductor package depicted in FIG. 5A.

With reference to FIGS. 5A and 5B, the structure of the semiconductor package 100D of the embodiment is similar to the structure of the semiconductor package 100B depicted in FIG. 3, while the difference between the semiconductor package 100D and the semiconductor package 100B lies in that a plurality of openings 142D of the patterned dielectric layer 140D in the embodiment are located at an edge of the patterned metal foil 110, and the openings 142D are cavities.

Figure 6:
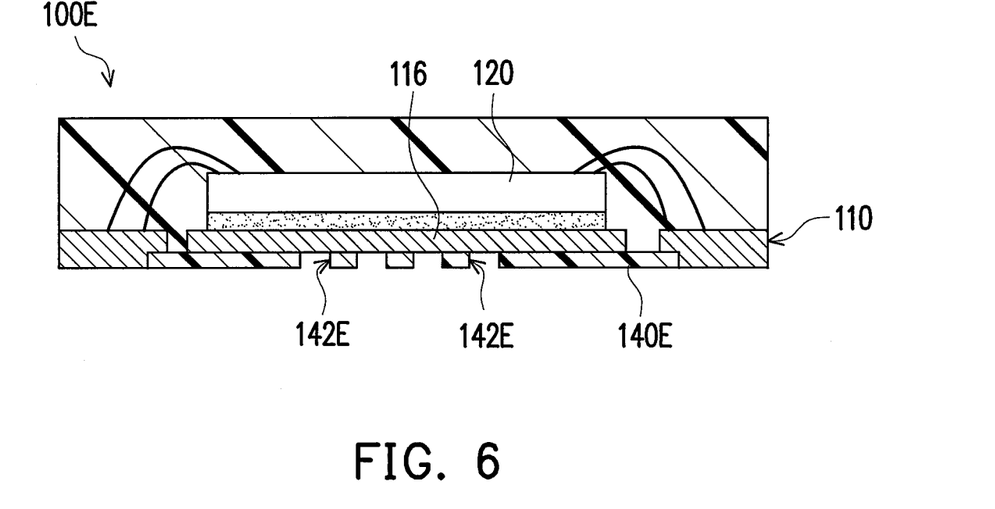

With reference to FIG. 6, the structure of the semiconductor package 100E of the embodiment is similar to the structure of the semiconductor package 100D depicted in FIG. 5, while the difference between the semiconductor package 100E and the semiconductor package 100D lies in that some openings 142E of the patterned dielectric layer 140E in the embodiment are located below the chip 120 and expose the die pad 116.

Figure 7:
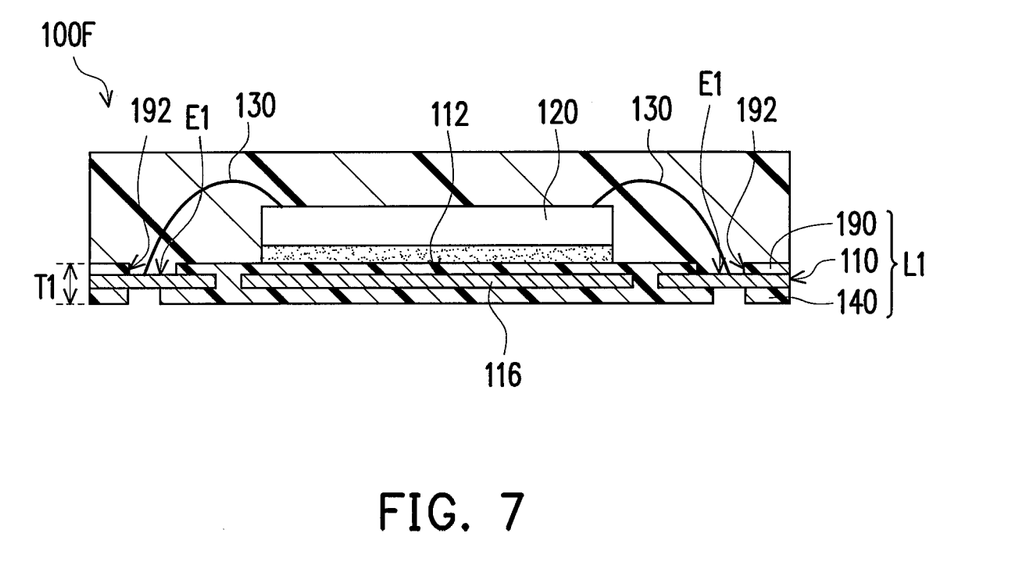

With reference to FIG. 7, the structure of the semiconductor package 100F of the embodiment is similar to the structure of the semiconductor package 100 depicted in FIG. 1, while the difference between the semiconductor package 100F and the semiconductor package 100 lies in that the semiconductor package 100F of the embodiment further includes a patterned dielectric layer 190. The patterned dielectric layer 190 is disposed on the first surface 112 of the patterned metal foil 110. Besides, the patterned dielectric layer 190 penetrates the patterned metal foil 110 and connects the patterned dielectric layer 140. In this embodiment, a total thickness T1 of the patterned dielectric layers 190 and 140 and the patterned metal foil 110 approximately ranges from 40 micrometers to 130 micrometers.

The patterned dielectric layer 190 has a plurality of openings 192 exposing a portion of the first surface 112 to form a plurality of first joints E1 for upward external electrical connection. In the embodiment, the patterned dielectric layer 190 covers a portion of the die pad 116. Besides, a material of the patterned dielectric layer 190 is solder mask (SM), liquid crystal polyester (LCP), or prepreg (PP). The wires 130 are connected from the chip 120 to the patterned metal foil 110 through the openings 192. In other embodiments, some openings (not shown) of the patterned dielectric layer 140 can be located right below the die pad 116 and expose the die pad 116.

Figure 8:
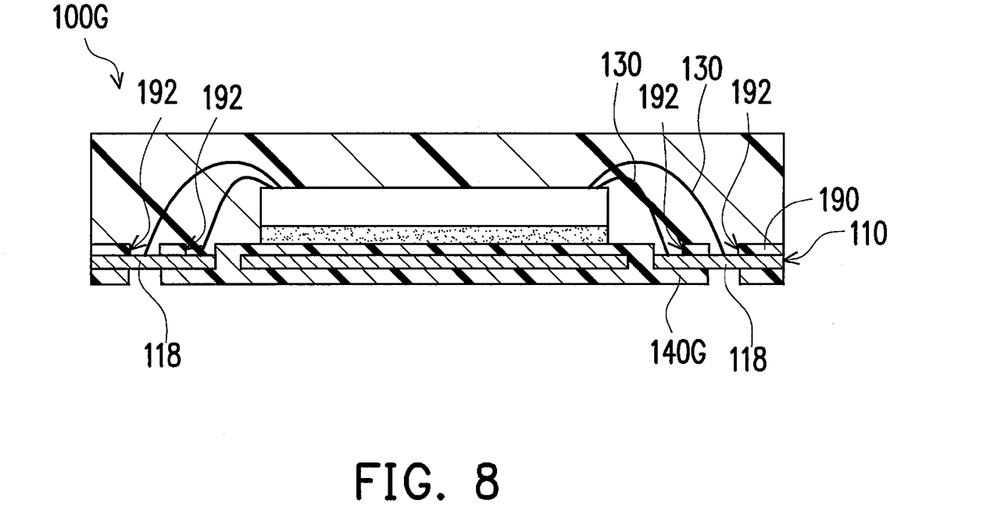

With reference to FIG. 8, the structure of the semiconductor package 100G of the embodiment is similar to the structure of the semiconductor package 100F depicted in FIG. 7, while the difference between the semiconductor package 100G and the semiconductor package 100F lies in that a portion of the patterned dielectric layer 140G in the embodiment is located below the openings 192. As such, a portion of the patterned metal foil 110 impacted by the wire-bonding process can be supported by the patterned dielectric layer 140G, such that the patterned metal foil 110 is not overly distorted, and that yield of the wire-bonding process can be improved.

Additionally, according to this embodiment, the patterned dielectric layer 190 can have a plurality of openings 192, two of which can expose the same lead 118 and selectively allow two of the wires 130 to pass through said two of the openings 192 and connect the same lead 118.

Figure 9:
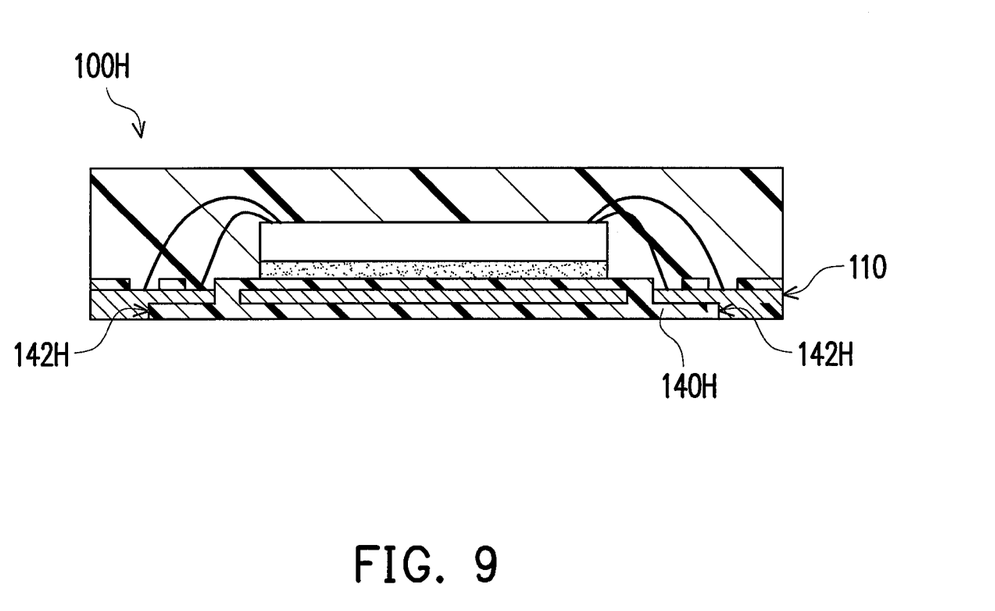

With reference to FIG. 9, the structure of the semiconductor package 100H of the embodiment is similar to the structure of the semiconductor package 100G depicted in FIG. 8, while the difference between the semiconductor package 100H and the semiconductor package 100G lies in that some openings 142H of the patterned dielectric layer 140H in the embodiment are located at an edge of the patterned metal foil 110.

Figure 10:
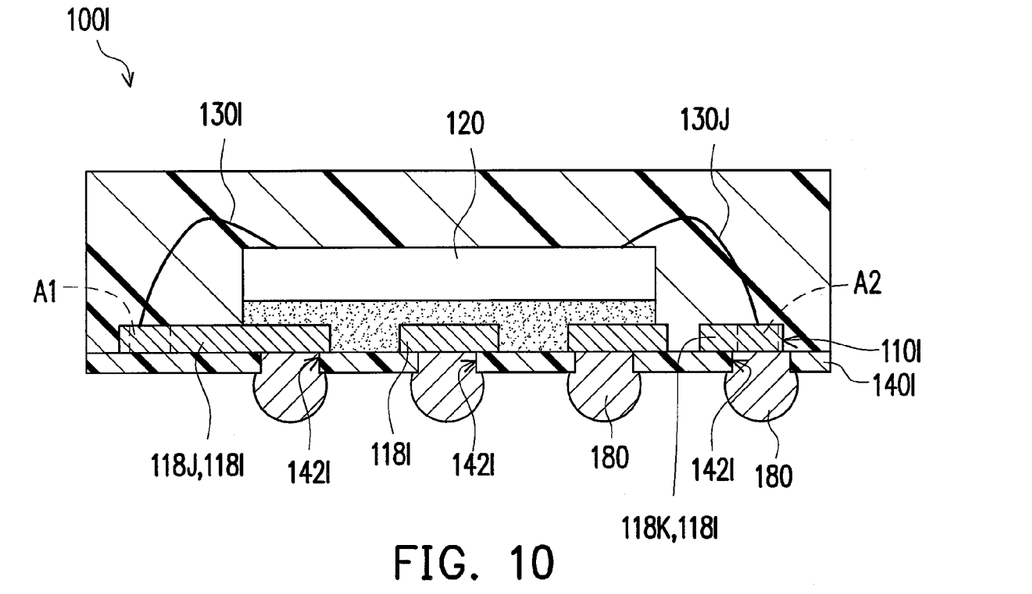
Figure 11:
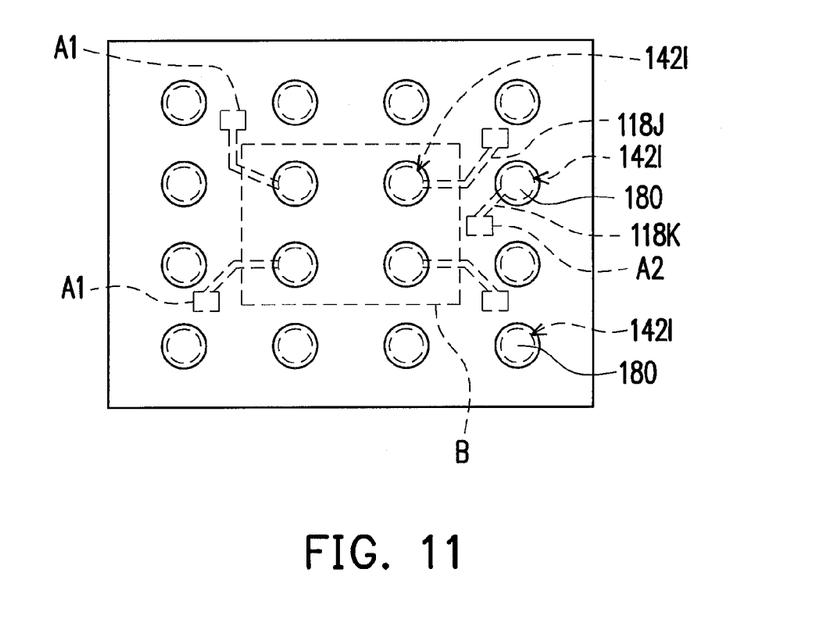
FIG. 11 is a bottom view illustrating the semiconductor package depicted in FIG. 10.

With reference to FIGS. 10 and 11, the structure of the semiconductor package 100I of the embodiment is similar to the structure of the semiconductor package 100 depicted in FIG. 1, while the difference between the semiconductor package 100I and the semiconductor package 100 lies in that the patterned metal foil 110I of the embodiment has a plurality of leads 118I, and that the chip 120 is disposed on the leads 118I. Note that an area B in FIG. 11 represents the area located below the chip 120.

According to the embodiment, the leads 118I include fan-in leads 118J extending from the periphery of the chip 120 to the downside of the chip 120. Specifically, the chip 120 is disposed on the leads 118J, and the wires 130I connect the chip 120 and a wire-bonding portion A1 of the leads 118J. Here, openings 142I of the patterned dielectric layer 140I which are located below the chip 120 (i.e. the area B) expose a portion of the leads 118J which carries the chip 120. In other words, by adjusting arrangement of the leads 118J and the position of the openings 142I of the patterned dielectric layer 140I, the joints of the semiconductor package 100I for external electrical connection can be located below the chip 120 according to the embodiment, so as to increase the area where the joints can be disposed and decrease the density of the joints.

In addition, according to the embodiment, the leads 118I can further include fan-out leads 118K extending away from the chip 120. Particularly, the wires 130J connect the chip 120 and a wire-bonding portion A2 of the leads 118K, and the openings 142I of the patterned dielectric layer 140I which are located at the periphery of the chip 120 can expose the leads 118K. That is to say, by adjusting arrangement of the leads 118K and the position of the openings 142I of the patterned dielectric layer 140I, the joints of the semiconductor package 100I for external electrical connection can be located at the periphery of the chip 120 or even close to the edge of the substrate.

On the other hand, according to the embodiment, a plurality of solder balls 180 can be alternatively disposed in the openings 142I of the patterned dielectric layer 140I, respectively, and the solder balls 180 are electrically connected to the leads 118I. The solder balls 180 are, for example, dummy balls (not shown).

Figure 12:
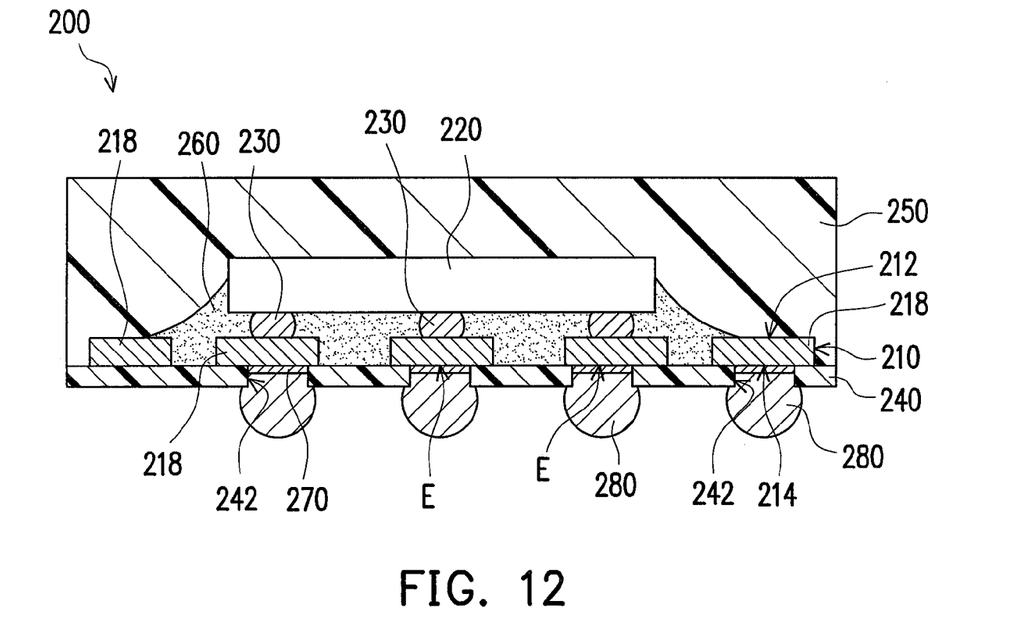
FIG. 12 is a cross-sectional view illustrating a semiconductor package according to another embodiment of the disclosure.
Figure 13:
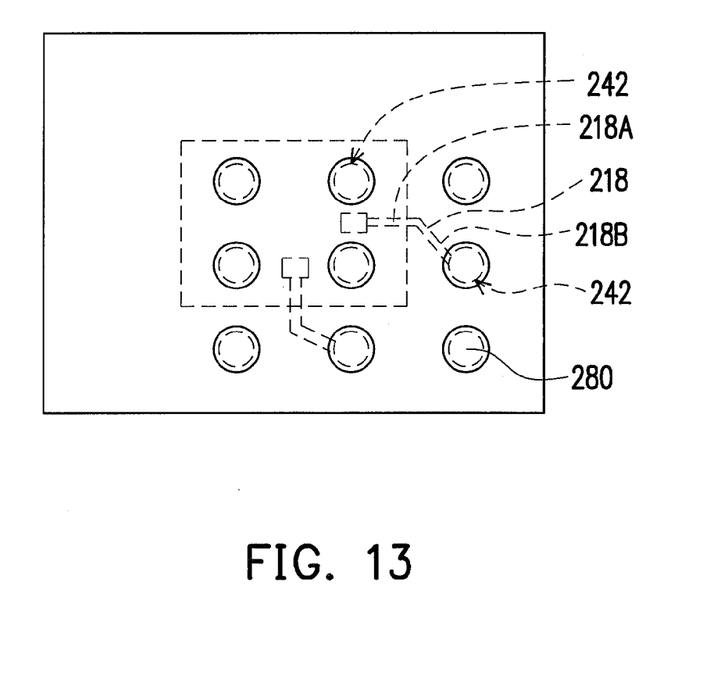
FIG. 13 is a bottom view illustrating the semiconductor package depicted in FIG. 12.
Figure 14:
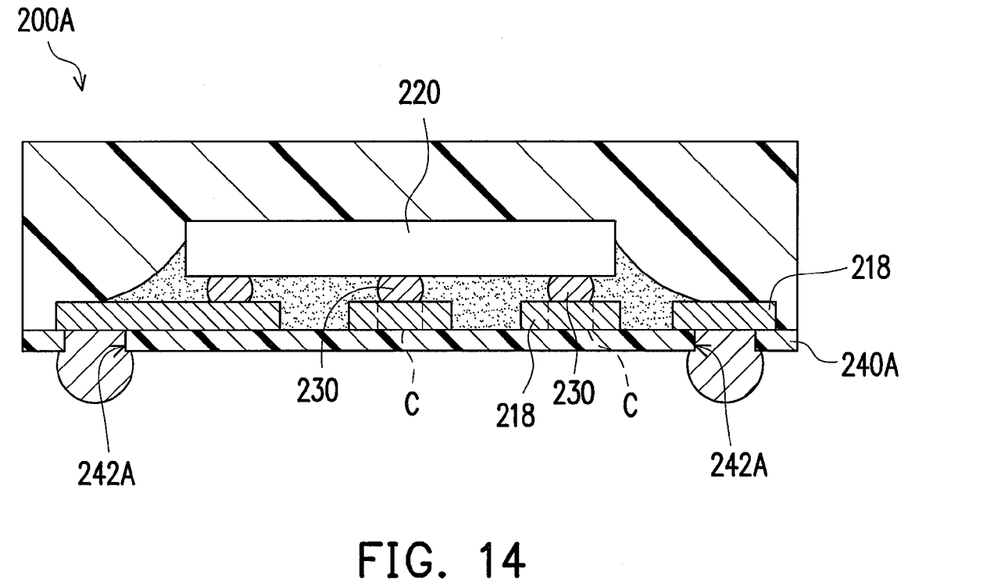
FIG. 14 is a cross-sectional view illustrating a semiconductor package according to another embodiment of the disclosure.
Figure 15:
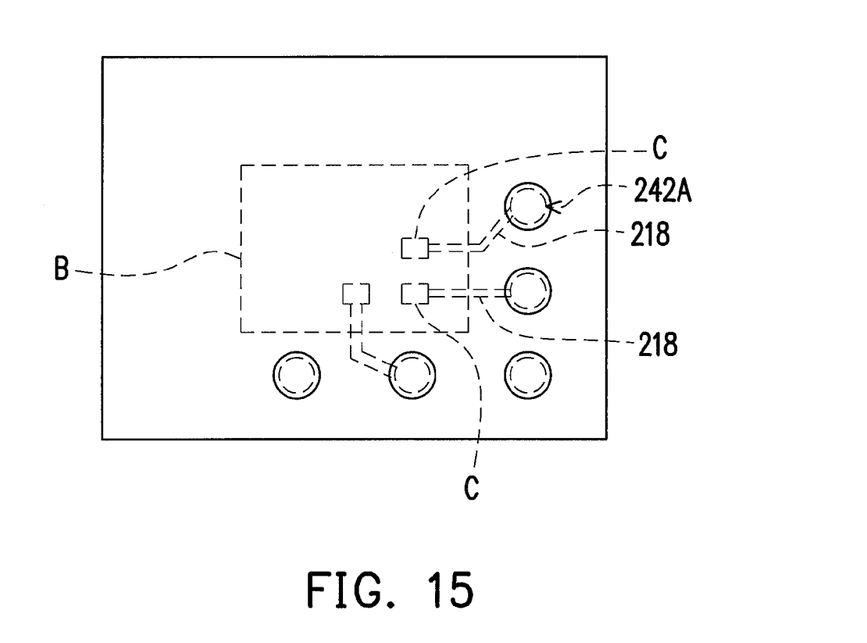
FIG. 15 is a bottom view illustrating the semiconductor package depicted in FIG. 14.

FIG. 12 is a cross-sectional view illustrating a semiconductor package according to another embodiment of the disclosure. FIG. 13 is a bottom view illustrating the semiconductor package depicted in FIG. 12. FIG. 14 is a cross-sectional view illustrating a semiconductor package according to another embodiment of the disclosure. FIG. 15 is a bottom view illustrating the semiconductor package depicted in FIG. 14.

As indicated in FIGS. 12 and 13, the semiconductor package 200 of the embodiment includes a patterned metal foil 210, a chip 220, a plurality of conductive bumps 230, a patterned dielectric layer 240, and a molding compound 250. The patterned metal foil 210 has a first surface 212 and a second surface 214 opposite to the first surface 212. The chip 220 is disposed on the first surface 212. In the embodiment, the patterned metal foil 210 includes a plurality of leads 218. Each of the leads 218 has an bearing end 218A carrying the chip 220 and an extension end 218B extending away from the chip 220.

The conductive bumps 230 are disposed between the chip 220 and the patterned metal foil 210 to electrically connect the chip 220 and the patterned metal foil 210. Here, the conductive bumps 230 are, for example, copper pillars, copper stud bumps, or golden stud bumps. In the embodiment, to prevent the conductive bumps 230 from external contamination or damages and to secure the connection between the chip 220 and the patterned metal foil 210, an underfill 260 can optionally be disposed between the chip 220 and the patterned metal foil 210 to encapsulate the conductive bumps 230 and connect the chip 220 and the patterned metal foil 210. The molding compound 250 is disposed on the first surface 212 and covers the chip 220, the conductive bumps 230, the underfill 260, and the patterned metal foil 210.

The patterned dielectric layer 240 is disposed on the second surface 214 and has a plurality of openings 242 exposing a portion of the second surface 214 to form a plurality of joints E for downward external electrical connection. Some of the openings 242 in the embodiment are located at the periphery of the chip 220 and expose the extension ends 218B of the leads 218, while the other openings 242 are located below the chip 220 and expose the leads 218 located below the chip 220.

According to the embodiment, a surface treatment layer 270 can be formed on the joints E. In addition, according to the embodiment, a plurality of solder balls 280 are disposed within the openings 242 of the patterned dielectric layer 240, respectively, and the solder balls 280 are electrically connected to the patterned metal foil 210.

With reference to FIGS. 14 and 15, the structure of the semiconductor package 200A of the embodiment is similar to the structure of the semiconductor package 200 depicted in FIG. 12, while the difference between the semiconductor package 200A and the semiconductor package 200 lies in that a plurality of openings 242A of the patterned dielectric layer 240A in the embodiment are all located at the periphery of the chip 220.

Namely, all of the openings 242A of the patterned dielectric layer 240A are located at the periphery of the area B below the chip 220.

In the embodiment, the leads 218 of the semiconductor package 200A all refer to the fan-out leads, such that the joints of the semiconductor package 200A for external electrical connection are all located at the periphery of the chip 220. As indicated in FIG. 15, interconnections C between the conductive bumps 230 and the leads 218 are all located in the area B below the chip 220. The leads 218 extend away from the chip 220. The openings 242A expose ends of the leads 218 away from the chip 220.

Based on the above, a carrying board formed by the patterned metal foil and the patterned dielectric layer can securely carry the chip according to the disclosure. Besides, the carrying board is rather thin and accordingly does not increase the entire thickness of the semiconductor package, which is conducive to minimization of the semiconductor package. Moreover, the patterned metal foil of the embodiment is quite thin as well, and therefore the manufacturing costs can be reduced.

Although the disclosure has been described with reference to the above embodiments, it will be apparent to one of the ordinary skill in the art that modifications to the described embodiment may be made without departing from the spirit of the disclosure. Accordingly, the scope of the disclosure will be defined by the attached claims not by the above detailed descriptions.

What is claimed is:

1. A semiconductor package, comprising:
   a patterned metal foil having a first surface and a second surface opposite to the first surface;
   a first patterned dielectric layer disposed on the second surface of the patterned metal foil, wherein the first patterned dielectric layer has a plurality of openings exposing at least a portion of the patterned metal foil to form a plurality of contacts for downward external electrical connection;
   a second patterned dielectric layer disposed over the patterned metal foil, wherein the second patterned dielectric layer exposes at least a portion of the patterned metal foil to form a plurality of contacts for upward electrical connection;
   a chip disposed on the first surface of the patterned metal foil;
   an adhesive layer disposed between the chip and the patterned metal foil;
   a plurality of wires respectively connecting the chip and the patterned metal foil, wherein a portion of the first patterned dielectric layer is disposed below intersections between the wires and the patterned metal foil; and
   a molding compound disposed on the first surface, wherein the molding compound covers the chip and the wires,
   wherein a total thickness of the patterned metal foil, the first patterned dielectric layer, and the second patterned dielectric layer substantially ranges from 40 micrometers to 130 micrometers.

2. The semiconductor package as claimed in claim 1, wherein the patterned metal foil comprises a die pad over which the chip is disposed.

3. The semiconductor package as claimed in claim 1, further comprising a surface treatment disposed on at least one of the contacts for downward external electrical connection and within a respective opening.

4. The semiconductor package as claimed in claim 1, wherein the patterned metal foil comprises a plurality of leads, and at least one of the leads is exposed at a lateral periphery of the semiconductor package.

5. The semiconductor package as claimed in claim 1, wherein the patterned metal foil comprises:
   a plurality of leads, wherein at least one of the leads extends below the chip, at least one of the wires connects the chip and the at least one of the leads, and at least one of the openings is located below the chip to expose a portion of the at least one of the leads extending below the chip.

6. The semiconductor package as claimed in claim 1, wherein the patterned metal foil comprises:
   a plurality of leads, wherein at least one of the leads extends away from the chip, at least one of the wires connects the chip and the at least one of the leads, and at least one of the openings is located at a periphery of the chip to expose the at least one of the leads.

7. The semiconductor package as claimed in claim 1, wherein some of the openings are located at an edge of the patterned metal foil, and the some of the openings are cavities.

8. The semiconductor package as claimed in claim 1, wherein the patterned metal foil comprises a lead, and a lower surface of the lead is substantially coplanar with a lower surface of the first patterned dielectric layer.

9. A semiconductor package, comprising:
   a patterned metal foil having a first surface and a second surface opposite to the first surface, the patterned metal foil comprising:
   a die pad; and
   a plurality of leads disposed at a periphery of the die pad;
   a first patterned dielectric layer disposed on the second surface of the patterned metal foil, wherein the first patterned dielectric layer has a plurality of openings exposing at least a portion of the patterned metal foil to form a plurality of contacts for downward external electrical connection, and some of the openings are located right below the die pad and expose the die pad;
   a chip disposed on the first surface of the patterned metal foil and located on the die pad;
   an adhesive layer disposed between the chip and the patterned metal foil;
   a plurality of wires respectively connecting the chip and the patterned metal foil, wherein at least some of the wires connect the leads; and
   a molding compound disposed on the first surface, wherein the molding compound covers the chip and the wires,
   wherein a total thickness of the patterned metal foil and the first patterned dielectric layer is in a range of 40 micrometers to 130 micrometers.

10. The semiconductor package as claimed in claim 9, wherein the die pad is a contiguous conductive layer.

11. The semiconductor package as claimed in claim 9, further comprising:
   a surface treatment disposed on at least one of the contacts and within a respective opening.

12. The semiconductor package as claimed in claim 9, wherein a thickness of at least one of the leads is greater than a thickness of the die pad.

13. The semiconductor package as claimed in claim 9, further comprising:
   a second patterned dielectric layer disposed over the patterned metal foil, wherein the second patterned dielectric layer exposes at least a portion of the patterned metal foil to form a plurality of contacts for upward electrical connection, and a total thickness of the patterned metal foil, the first patterned dielectric layer, and the second patterned dielectric is in a range of 40 micrometers to 130 micrometers.

14. The semiconductor package as claimed in claim 9, wherein the die pad comprises a plurality of discrete structures.

15. A semiconductor package, comprising:
a patterned metal foil having a first surface and a second surface opposite to the first surface;
a patterned dielectric layer disposed on the second surface of the patterned metal foil, wherein the patterned dielectric layer has a plurality of openings exposing at least a portion of the patterned metal foil, and a plurality of contacts are formed for downward external electrical connection;
a chip disposed on the first surface;
a plurality of conductive bumps disposed between the chip and the patterned metal foil; and
a molding compound disposed on the first surface, wherein the molding compound covers the chip and the conductive bumps,
wherein a total thickness of the patterned metal foil and the patterned dielectric layer is in a range of 40 micrometers to 130 micrometers.

16. The semiconductor package as claimed in claim 15, wherein the patterned metal foil comprises:
a plurality of leads, wherein each of the leads has a bearing end carrying the chip and an extension end extending away from the chip, and the openings respectively expose the extending ends of the leads and are located at a periphery of the chip.

17. The semiconductor package as claimed in claim 15, wherein some of the openings are located below the chip.

18. The semiconductor package as claimed in claim 15, further comprising:
an underfill disposed between the chip and the patterned metal foil, wherein the underfill encapsulates the conductive bumps.

19. The semiconductor package as claimed in claim 15, wherein the molding compound is further disposed between the chip and the patterned metal foil so as to encapsulate the conductive bumps.

20. The semiconductor package as claimed in claim 15, further comprising:
a second patterned dielectric layer disposed over the patterned metal foil, wherein the second patterned dielectric layer exposes at least a portion of the patterned metal foil to form a plurality of contacts for upward electrical connection.

* * * * *